United States Patent
Xu (10) Patent No.: US 12,424,451 B2
(45) Date of Patent: Sep. 23, 2025

(54) METHOD FOR REDUCING CONTACT RESISTANCE

(71) Applicant: Shanghai Huali Integrated Circuit Corporation, Shanghai (CN)

(72) Inventor: Wensheng Xu, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 391 days.

(21) Appl. No.: 18/201,474

(22) Filed: May 24, 2023

(65) Prior Publication Data

US 2024/0105464 A1    Mar. 28, 2024

(30) Foreign Application Priority Data

Sep. 28, 2022 (CN) .......................... 202211187633.9

(51) Int. Cl.
| | |
|---|---|
| H01L 21/3205 | (2006.01) |
| H01L 21/02 | (2006.01) |
| H01L 21/3105 | (2006.01) |
| H01L 21/311 | (2006.01) |
| H01L 21/321 | (2006.01) |

(Continued)

(52) U.S. Cl.
CPC .. *H01L 21/32053* (2013.01); *H01L 21/02164* (2013.01); *H01L 21/0217* (2013.01); *H01L 21/02186* (2013.01); *H01L 21/02334* (2013.01); *H01L 21/02362* (2013.01); *H01L 21/31053* (2013.01); *H01L 21/31111* (2013.01); *H01L 21/321* (2013.01); *H10D 30/024* (2025.01); *H10D 64/01* (2025.01)

(58) Field of Classification Search
CPC ......... H01L 21/32053; H01L 21/02164; H01L 21/0217; H01L 21/02186; H01L 21/02334; H01L 21/02362; H01L 21/31053; H01L 21/31111; H01L 21/321; H10D 64/01; H10D 30/024
See application file for complete search history.

(56) References Cited

U.S. PATENT DOCUMENTS

| | | | | |
|---|---|---|---|---|
| 2011/0260264 A1* | 10/2011 | Luo | ...................... | H10D 64/021 257/E21.409 |
| 2017/0032975 A1* | 2/2017 | Tai | .................... | H01L 21/02063 |

(Continued)

OTHER PUBLICATIONS ip.com search (Year: 2025).*
Espacet.net search (Year: 2025).*

*Primary Examiner* — Zandra V Smith
*Assistant Examiner* — Andre C Stevenson
(74) *Attorney, Agent, or Firm* — Banner & Witcoff, Ltd.

(57) ABSTRACT

The present application provides a method for reducing contact resistance. The contact holes of a gate structure comprising: metal gates, a source and drain structure located between the metal gates, a recess formed by using the outer side wall of the metal gates as a side wall and the upper surface of the source and drain structure as a bottom; a silicon nitride layer provided at the bottom of the recess; an oxide provided within the recess; a silicon oxide layer covering contact holes, contact holes are connected with the source and drain structure and the metal gate, respectively; Ti and TiN are deposited on the surfaces of the contact holes to form a Co seed layer; Co fills inside the contact holes; and Ti at the bottoms of the contact holes reacts with silicon in the source and drain structure to form TiSi.

12 Claims, 5 Drawing Sheets

(51) Int. Cl.
*H10D 30/01* (2025.01)
*H10D 64/01* (2025.01)

(56) References Cited

U.S. PATENT DOCUMENTS

2018/0090508 A1* 3/2018 Ogata .................. H10D 30/696
2021/0265264 A1* 8/2021 Chou ................ H01L 21/76807

* cited by examiner

FIG. 8 step 1. providing a semiconductor structure comprising a silicon substrate, metal gates located separating from each other on the silicon substrate, and a source and drain structure located between the metal gates, on the upper surface of the silicon substrate and with a height lower than the metal gates; wherein a recess is formed by using the outer side wall of the metal gates as a side wall and the upper surface of the source and drain structure as a bottom; a silicon nitride layer is provided at the bottom of the recess; an oxide is provided within the recess; and the top of the metal gate and the upper surface of the oxide are covered with a silicon oxide layer

↓ step 2. forming contact holes communicated with the upper surface of the source and drain structure and the upper surfaces of the metal gates, respectively, wherein the contact holes communicated with the source and drain structure are formed by etching the silicon oxide layer above the recess, the oxide within the recess and the silicon nitride layer at the bottom of the recess; and the contact holes communicated with the upper surfaces of the metal gates are formed by etching the silicon oxide layer above the metal gates

↓ step 3. clearing by-products resulting from forming the contact holes via etching by using ion bombardment

↓

Step 4. depositing Ti and TiN sequentially on the surfaces of the contact holes

↓ step 5 forming a seed layer of Co on the surfaces of the contact holes in which Ti and TiN are deposited; thereafter filling Co within the contact holes; and after Co is filled within the contact holes, further covering the upper surface of the silicon oxide layer with Co

↓ step 6. performing chemical mechanical polishing for Co at the upper surface of the silicon oxide layer and the upper portion of the contact holes after being filled with Co, until Ti and TiN at the upper surface of the silicon oxide layer are removed

↓ step7. forming a cap layer covering the upper surface of Co within the contact holes and the upper surface of the silicon oxide layer

↓ step8. performing laser annealing, wherein Ti located at the bottoms of the contact holes in the source and drain structure reacts with silicon in the source and drain structure during the annealing process to form TiSi

FIG. 9

METHOD FOR REDUCING CONTACT RESISTANCE

CROSS-REFERENCES TO RELATED APPLICATIONS

This application claims priority to Chinese patent application No. CN 202211187633.9, filed on Sep. 28, 2022 at CNIPA, and entitled "A METHOD FOR REDUCING CONTACT RESISTANCE", the disclosure of which is incorporated herein by reference in its entirety.

TECHNICAL FIELD

The present application relates to the field of semiconductor technology, and in particular, to a method for reducing contact resistance.

BACKGROUND

As semiconductor process technology improves, FinFET and Gate All Around (GAA) processes have been released, in these devices, a smaller sizes in the mid-section process are required. Comparing to the technology nodes prior to deep UV, nanometer or micrometer semiconductor processes, the size and characteristics of a CMOS device itself have the greatest impact on the electrical performance thereof. As the size shrank, the contact resistance of a mid-section and the inherent resistance of a metal wire have an increasingly large impact on device performance. In order to reduce the impact on electrical properties, the progress for the mid-section is made from the tungsten (W) connection process to the copper (Co) connection process, leading to lower metal wire resistance, thereby reducing the impact of the metal wire on the device performance. However, the contact area between a mid-section metal and an active region has become smaller from changes of the metal connection process and size miniaturization, thus contact resistance Rc has become an important factor limiting the device performance. And more complex and increasingly more difficult degree of manufacturing process has made yield improvement more difficult. After emergence of the 7 nm process, the wire connection process for the mid-section contact hole is one of the most important factors which limit the product yield.

In order to reduce the contact resistance Rc, a conventional method in the art is to deposit a metal film of Ti/Ni/Co or the like to form TiSi or NiSi with Si to reduce the Schottky barrier. In order to protect this metal film during subsequent metal filling, a further TiN passivation layer needs to be deposited to protect the previously deposited metal, then a seed layer of a metal is deposited, finally the connection recess is fully filled with metal by chemical vapor deposition (CVD) or chemical plating (ECP), and a complete metal interconnection layer is formed after chemical mechanical polishing (CMP). The above method has the problem that a resistance value of a TiN passivation layer is high, which significantly increases the contact resistance between a metal and a source or a drain of the device. Moreover, in order to ensure a good protective effect for a metal layer, the thickness of TiN cannot be too thin, often above 20 Å.

BRIEF SUMMARY

The present application aims to provide a method for reducing contact resistance that a high resistance of a TiN passivation layer increases the contact resistance between a metal and a source or drain of a device and thus reduces the device performance.

To achieve the above and other related purposes, the present application provides a method for reducing contact resistance comprising steps as the following at least:

step 1: providing a semiconductor structure which includes a silicon substrate and metal gates which are located separately from each other on the silicon substrate, and a source and drain structure located between the metal gates, on the upper surface of the silicon substrate and with a height lower than that of the metal gates; wherein a recess is formed by using the outer side wall of the metal gates as a side wall and the upper surface of the source and drain structure as a bottom; a silicon nitride layer is provided at the bottom of the recess; an oxide is provided within the recess; and the top of the metal gate and the upper surface of the oxide are covered with a silicon oxide layer;

step 2: forming contact holes connected connecting with the upper surface of the source and drain structure and the upper surfaces of the metal gates, respectively, wherein the contact holes connected connecting with the source and drain structure are formed by etching the silicon oxide layer above the recess, the oxide within the recess and the silicon nitride layer at the bottom of the recess; and the contact holes connected with the upper surfaces of the metal gates are formed by etching the silicon oxide layer above the metal gates;

step 3: clearing by-products resulting from forming the contact holes via etching by using ion bombardment;

step 4: depositing Ti and TiN sequentially on the surfaces of the contact holes;

step 5: forming a seed layer of Co on the surfaces of the contact holes in which Ti and TiN are deposited; thereafter filling Co within the contact holes; and after the Co layer fills within the contact holes, further covering the upper surface of the silicon oxide layer with Co;

step 6: performing chemical mechanical polishing for Co at the upper surface of the silicon oxide layer and the upper portion of the contact holes after being filled with Co, until Ti and TiN at the upper surface of the silicon oxide layer are removed;

step 7: forming a cap layer covering the upper surface of Co within the contact holes and the upper surface of the silicon oxide layer; and performing annealing, wherein Ti located at the bottoms of the contact holes in the source and drain structure reacts with silicon in the source and drain structure during the annealing process to form TiSi.

According to one embodiment, the oxide filled within the recess in step 1 is silicon oxide.

According to one embodiment, the side walls within the recess in step 1 are sequentially provided with a first dielectric layer and a second dielectric layer adhered to the first dielectric layer, and the bottom of the first dielectric layer and the bottom of the second dielectric layer are located respectively at the upper surface of the source and drain structure; and the oxide is filled in the space between the upper surface of the silicon nitride layer and the second dielectric layer at both sidewalls of the recess.

According to one embodiment, the metal gate in step 1 comprises a first U-shaped structure, a second U-shaped structure, a third U-shaped structure, and a third dielectric layer; and the first U-shaped structure, the second U-shaped structure, and the third U-shaped structure are stacked on top of each other from outside to inside, and the third dielectric layer is filled within the third U-shaped structure.

According to one embodiment, the contact holes connected with the upper surface of the source and drain structure and the contact holes connected with the upper surfaces of the metal gates formed in step 2 are formed in the same etching process.

According to one embodiment, Ar ion bombardment is used in step 3 to clear by-products resulting from forming the contact holes via etching.

According to one embodiment, Ti and TiN are also deposited sequentially on the upper surface of the silicon oxide layer while Ti and TiN are deposited sequentially on the surfaces of the contact holes in step 4.

According to one embodiment, a deposition method applies to form the seed layer of Co in step 5.

According to one embodiment, Co is filled within the contact holes by a chemical plating process in step 5.

According to one embodiment, the thickness of the silicon oxide layer remaining after polishing in step 6 is 210 Å.

According to one embodiment, the thickness of the cap layer formed in step 7 is 160 Å.

According to one embodiment, the cap layer in step 7 is silicon nitride.

As described above, the method of the present application for reducing contact resistance has the following beneficial effects: by the present application, on one hand, the thicknesses of the protective layer of Ti and TiN required during deposition of the seed layer of Co can be significantly reduced, thereby reducing resistance to improve the device performance; and on the other hand, applying laser annealing reduces a thermal load on the gate, and improves the performance uniformity and reliability of the device.

DETAILED DESCRIPTION OF THE DISCLOSURE

The implementation of the present application is illustrated in the following by specific embodiments, and other advantages and effects of the present application can be readily understood by those skilled in the art from the disclosure in the description. The present application may also be implemented or applied by further different specific implementations, and details in the description may be modified or changed in various ways based on different views and applications without departing from the spirit of the present application.

Please refer to FIGS. 1 to 9. It should be noted that the illustrations provided in the embodiments only schematically illustrate the basic concept of the present application. The figures only show components related to the application and are not draw according to the number, shape and size of components in actual implementation, and the pattern, number and proportion of the components in actual implementation may be arbitrarily changed, and the layout pattern of the components may be more complex.

Figure 1:
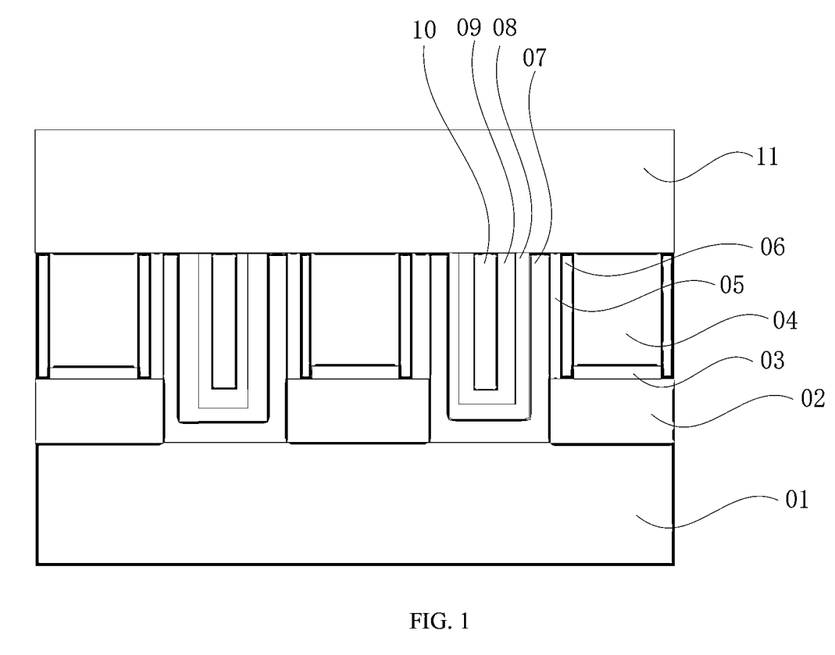
FIGS. 1 to 8 show schematic diagrams of the device structures for each step during the process of reducing contact resistance according to the present application.
Figure 9:
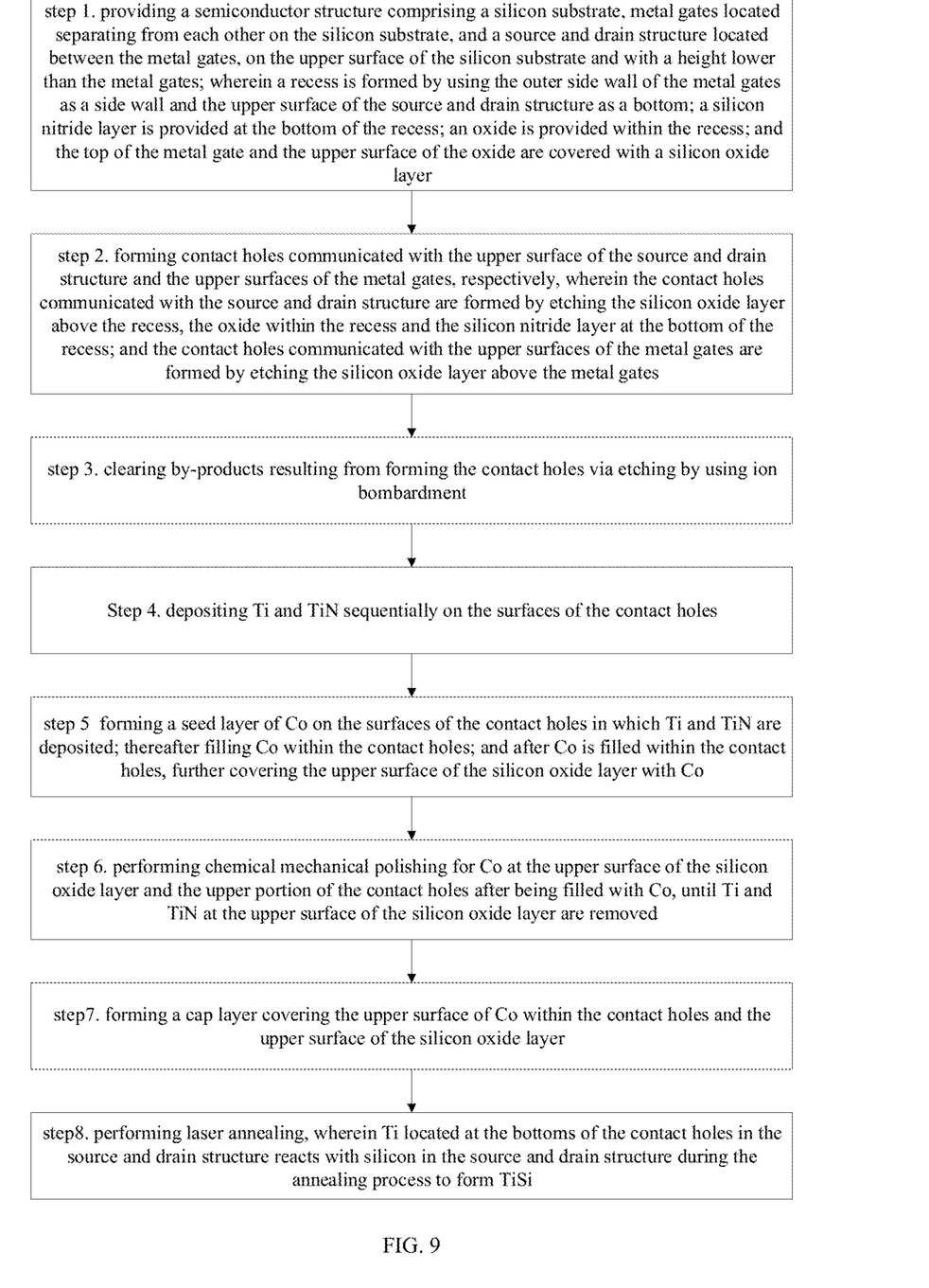
FIG. 9 shows a schematic flow diagram of the method for reducing contact resistance according to the present application.

The present application provides a method for reducing contact resistance, referring to FIG. 9, which shows a flow diagram of the method for reducing contact resistance in the present application, and the method includes at least the following steps:

step 1: providing a semiconductor structure comprising a silicon substrate, metal gates disposed on the silicon substrate separately from each other, and a source structure and drain structure located between the metal gates, on the upper surface of the silicon substrate and with heights lower than the metal gates; wherein a recess is formed by taking the outer side wall of the metal gates as a side wall and the upper surfaces of the source and drain structure as bottoms; a silicon nitride layer is provided at the bottom of the recess; an oxide is provided within the recess; and the top of the metal gate and the upper surface of the oxide are covered with a silicon oxide layer. Referring to FIG. 1, the semiconductor structure in step 1 includes a silicon substrate 01, metal gates located separately from each other on the silicon substrate 01, a source and drain structure 02 located between the metal gates, on the upper surface of the silicon substrate and with a height lower than the metal gates; a recess is formed by applying the outer side wall of the metal gates as a side wall and the upper surface of the source and drain structures 02 as a bottoms; a silicon nitride layer 03 is provided at the bottom of the recess; an oxide 04 is provided within the recess; and the top of the metal gate and the upper surface of the oxide 04 is covered with a silicon oxide layer 11.

Further in the present application, the oxide 04 filled within the recess in step 1 of this embodiment is silicon oxide.

Further in the present application, the side walls in the recess in step 1 of this embodiment are sequentially provided with a first dielectric layer 05 and a second dielectric layer 06 adhered to the first dielectric layer 05, and the bottoms of the first dielectric layer 05 and the second dielectric layer 06 are located at the upper surface of the source and drain structure 02; and the oxide 04 is filled in the space between the upper surface of the silicon nitride layer 03, and the second dielectric layer 06 at both side walls of the recess. In this embodiment, the first dielectric layer and the second dielectric layer are low-K dielectric layers.

Further in the present application, the metal gate in step 1 of this embodiment includes: a first U-shaped structure 07, a second U-shaped structure 08, a third U-shaped structure 09, and a third dielectric layer 10; the first U-shaped structure 07, the second U-shaped structure 08, and the third U-shaped structure 09 are stacked on top of each other from outside to inside, and the third dielectric layer 10 is filled within the third U-shaped structure 09. In this embodiment, the first U-shaped structure is TiAl, the second U-shaped structure is TiN, the third U-shaped structure is TaN, and the third dielectric layer is $HFO_2$.

Figure 2:
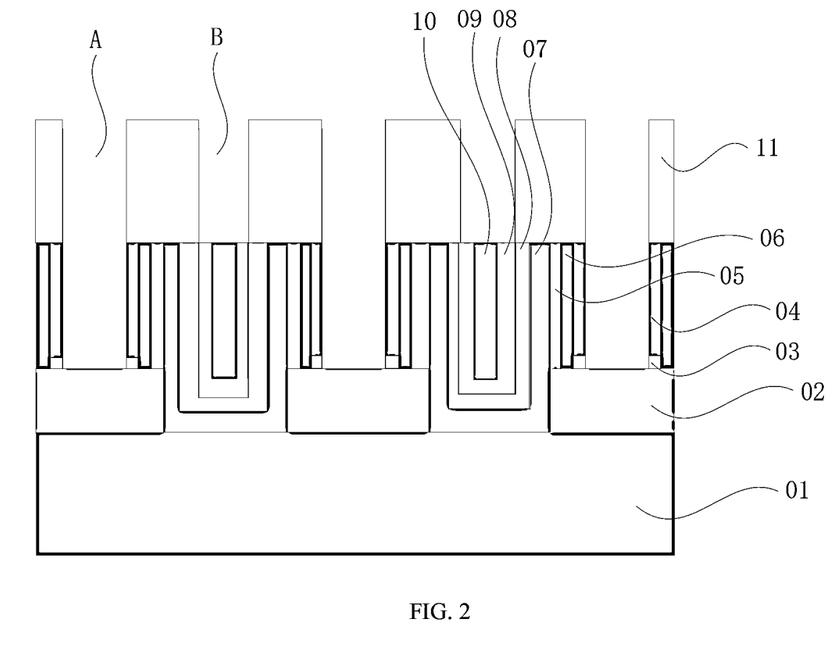

The method includes step 2: forming contact holes connected with the upper surface of the source and drain structure and the upper surfaces of the metal gates, respectively, wherein the contact holes connected with the source and drain structure are formed by etching the silicon oxide layer above the recess, the oxide within the recess and the silicon nitride layer at the bottom of the recess; and the contact holes connected with the upper surfaces of the metal gates are formed by etching the silicon oxide layer above the metal gates.

Referring to FIG. 2, in the step 2, contact holes are formed, which are connected with the upper surface of the source and drain structure 02 and the upper surfaces of the metal gates, respectively; the contact holes connected with the source and drain structure 02 are formed by etching the silicon oxide layer 11 above the recess, the oxide 04 within the recess and the silicon nitride layer 03 at the bottom of the recess; and the contact holes connected with the upper surfaces of the metal gates are formed by etching the silicon oxide layer 11 above the metal gates.

Further in the present application, the contact holes A connected with the upper surface of the source and drain structure 02 and the contact holes B connected with the upper surfaces of the metal gates formed in step 2 of this embodiment are formed in the same etching process.

The method includes step 3: clearing by-products resulting from forming the contact holes via etching by using ion bombardment.

Figure 3:
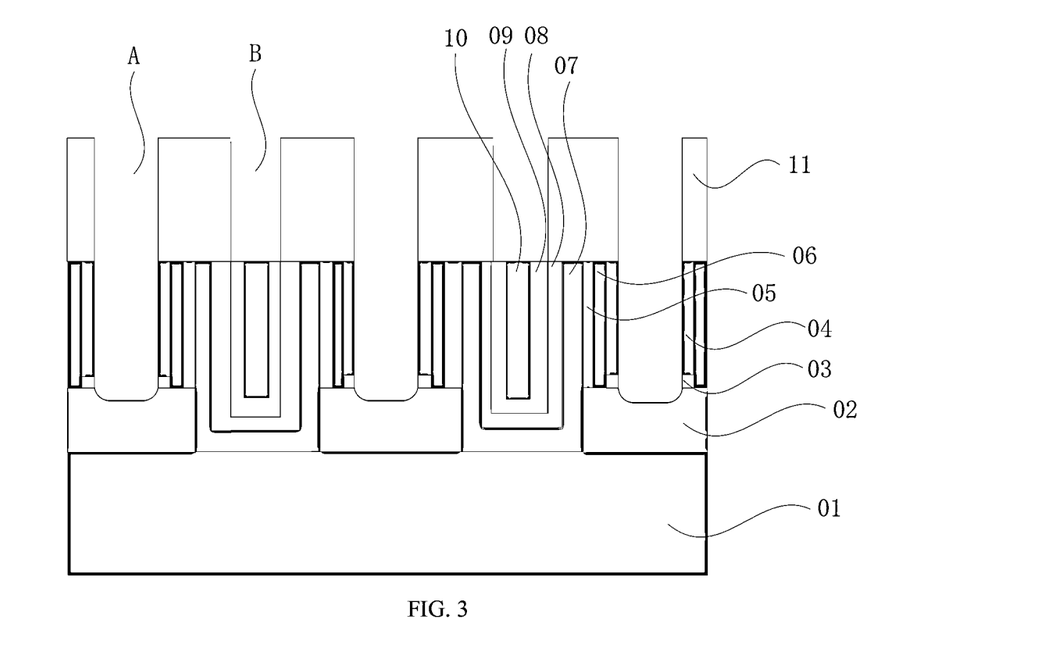

Further in the present application, Ar ion bombardment is used in step 3 of this embodiment to clear by-products resulting from forming the contact holes via etching. Referring to FIG. 3, in step 3 of this embodiment, argon (Ar) ion bombardment is applied to clear by-products resulting from forming the contact holes via etching.

Figure 4:
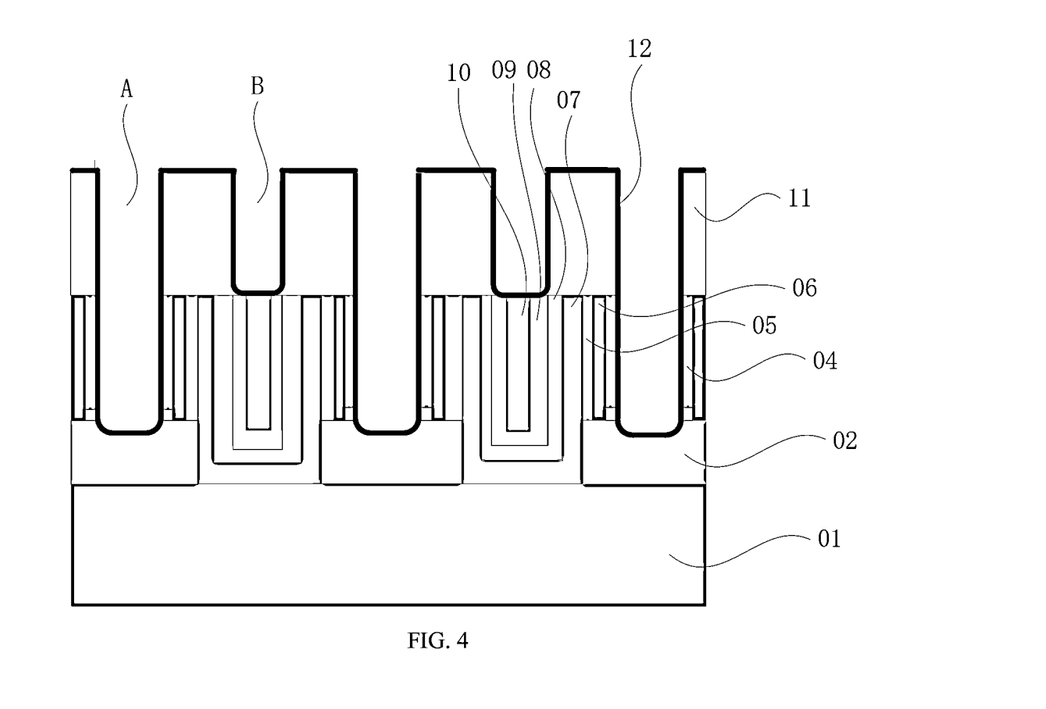

The method includes step 4, depositing Ti and TiN sequentially on the surfaces of the contact holes. Referring to FIG. 4, in the step 4, Ti and TiN are deposited sequentially on the surfaces of the contact holes, and the deposited Ti and TiN are indicated by Ti layer 12 in FIG. 4.

Further in the present application, Ti and TiN are also deposited sequentially on the upper surface of the silicon oxide layer 11 while Ti and TiN are deposited sequentially on the surfaces of the contact holes in step 6 in this embodiment.

Figure 5:
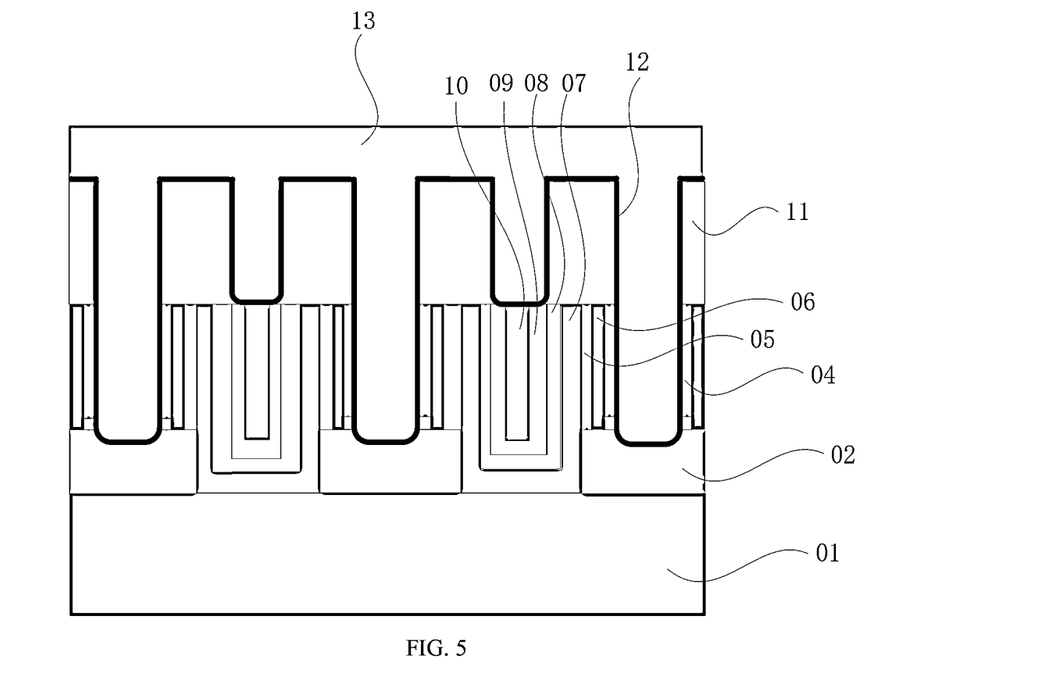

The method includes step 5: forming a seed layer of Co on the surfaces of the contact holes in which Ti and TiN are deposited; thereafter filling Co within the contact holes; and after Co is filled within the contact holes, further covering the upper surface of the silicon oxide layer with Co. Referring to FIG. 5, the seed layer of Co firstly formed by depositing and the Co filled afterwards are indicated by a Co layer 13 in FIG. 5.

Further in the present application, a deposition method is used to form the seed layer of Co in step 5 of this embodiment.

Further in the present application, Co is filled within the contact holes by chemical plating (ECP) in step 5 of this embodiment.

Figure 6:
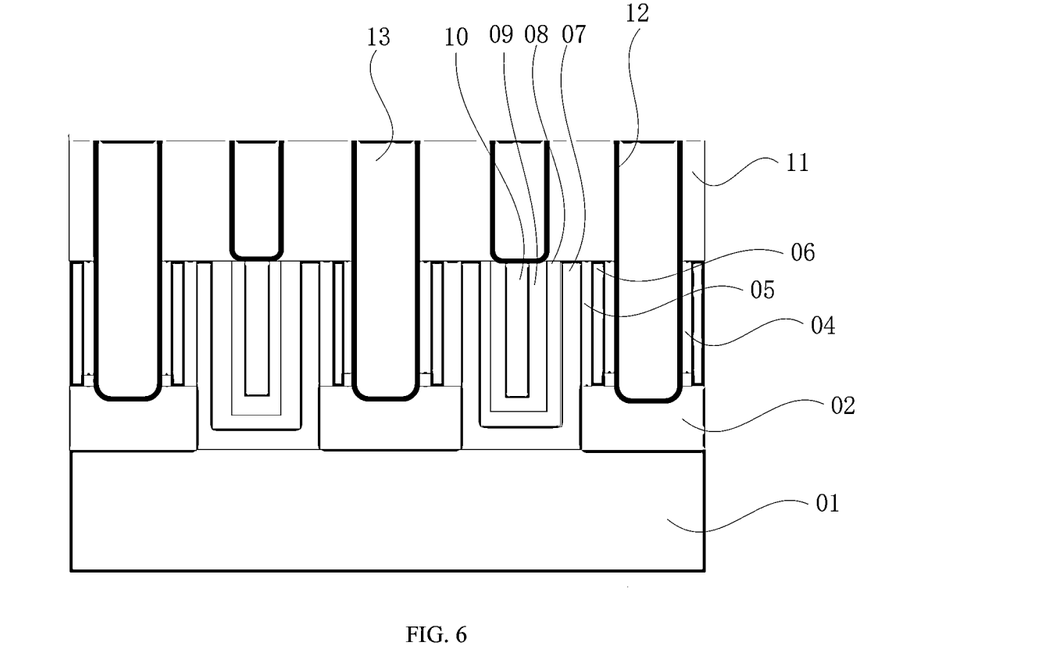

The method includes step 6: performing chemical mechanical polishing for Co at the upper surface of the silicon oxide layer and the upper portion of the contact holes after being filled with Co, until Ti and TiN at the upper surface of the silicon oxide layer are removed. Referring to FIG. 6, in the step 6, chemical mechanical polishing is performed for Co on the upper surface of the silicon oxide layer 11 and the upper portion (refer to Co above the contact holes) of the contact holes after filling with Co, until Ti and TiN on the upper surface of the silicon oxide layer 11 are removed.

Further in the present application, the thickness of the silicon oxide layer remaining after the polishing step 6 of this embodiment is about 210 Å.

Figure 7:
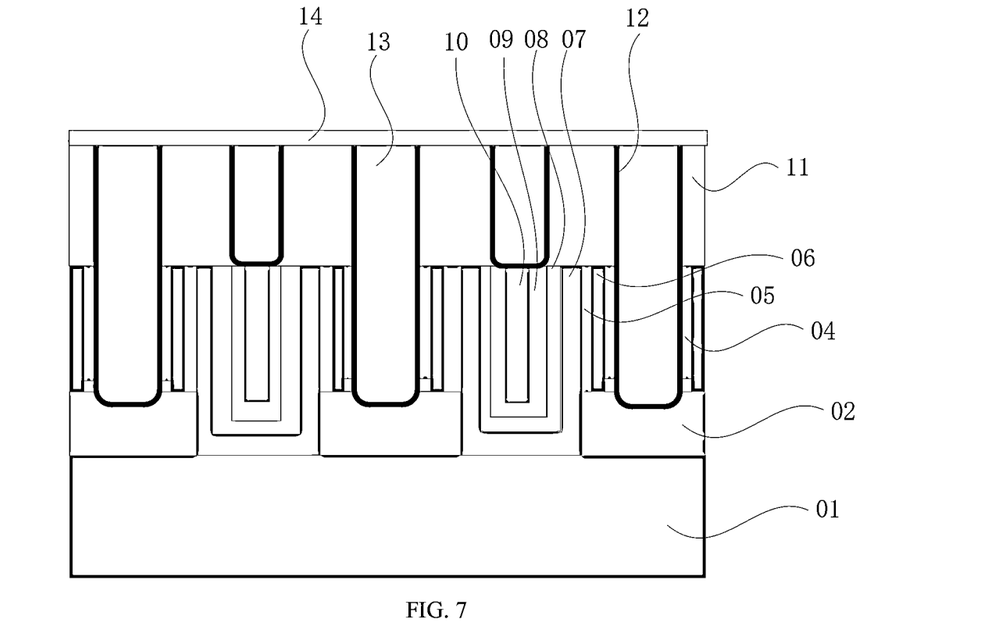

The method includes step 7: forming a cap layer covering the upper surface of Co within the contact holes and the upper surface of the silicon oxide layer. Referring to FIG. 7, a cap layer 14 covering the upper surface of Co within the contact holes and the upper surface of the silicon oxide layer is formed in the step 7.

Further in the present application, the thickness of the cap layer formed in step 7 of this embodiment is about 160 Å.

Further in the present application, the cap layer 14 in step 7 of this embodiment is silicon nitride.

Figure 8:
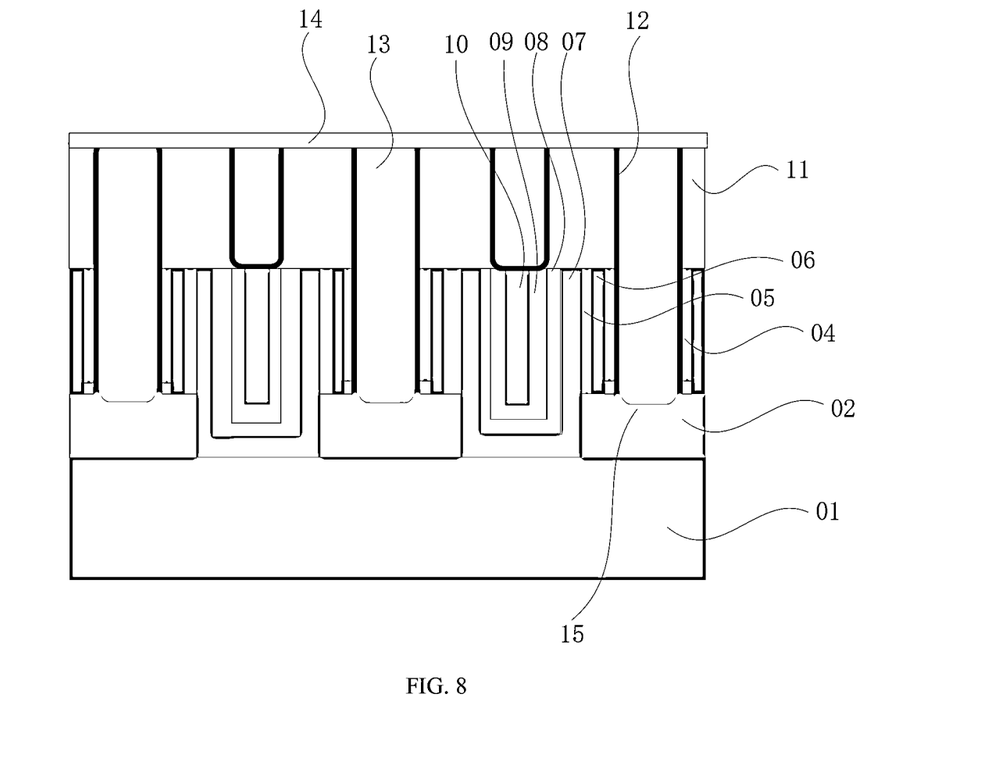

The method includes step 8: performing laser annealing, wherein Ti located at the bottoms of the contact holes in the source and drain structure reacts with silicon in the source and drain structure during the annealing process to form TiSi. Referring to FIG. 8, in the step 8, laser annealing is performed, wherein Ti located at the bottoms of the contact holes in the source and drain structure 02 reacts with silicon in the source and drain structure during the annealing process to form TiSi layer (15).

In summary, the present application proposes to postpone the heat treatment for TiSi formation. After etching of the holes connecting an active region and a gate is completed, Ti and very thin TiN are deposited immediately. Then a seed layer of Co is rapidly deposited, after which the hole is fully filled with Co by electroplating. Since there is no strong oxidizing gas and no heat treatment during the deposition of Co, very thick TiN is not required to protect Ti, so that the thickness of the protective layer TiN required for Ti during the deposition of the seed layer of Co can be significantly reduced, thereby significantly reducing the contact resistance between the metal and the active region to improve the device performance. On the other hand, Ti and TiN deposition is immediately followed by thermal treatment. Whereas spark anneal or soak anneal is used in conventional annealing, non-uniform heating can be easily caused from graphic loading because of uneven surfaces, which affects the efficiency of the thermal treatment and the amount of the contact resistance. And conventional soak anneal and spark anneal take longer to heat up so can lead to a relatively large thermal load on a gate. After postponing of the heat treatment, it is performed after CMP is completed to allow a flat surface of a sample, and it can be ensured that heating is more uniform for different graphic loads, so that the laser anneal with a shorter time can be used, with a high temperature and a short time. Thus, on the one hand, full reaction of Ti and Si can be allowed to reduce the contact resistance, and on the other hand, the impact on the gate can be reduced. Therefore, the present application effectively overcomes these problems in the conventional techniques and presents high application advantages in industry.

The above embodiments are only illustrative of the principle of the present application and effects thereof, and are not intended to limit the present application. Any person skilled in the art may modify or change the above embodiments without departing from the spirit and scope of the present application. Therefore, all equivalent modifications or alterations made by those skilled in the art shall still be covered by the claims of the present application without departing from the spirit and technical ideas revealed by the present application.

What is claimed is:

1. A method for reducing contact resistance in a gate structure, comprising following steps:
   step 1: providing a semiconductor structure comprising a silicon substrate, metal gates located separately from each other on the silicon substrate, and a source and drain structure located between the metal gates, on an upper surface of the silicon substrate, wherein a height of the source and drain structure is lower than a height of the metal gates; a recess formed by using an outer side wall of the metal gates as a side wall and an upper surface of the source and drain structure as a bottom of the recess; a silicon nitride layer provided at the bottom of the recess; an oxide provided within the recess;

wherein upper surfaces of the metal gates and an upper surface of the oxide are covered with a silicon oxide layer;

step 2: forming contact holes connected with the upper surface of the source and drain structure and the upper surfaces of the metal gates, respectively, wherein the contact holes connected with the source and drain structure are formed by etching the silicon oxide layer above the recess, the oxide within the recess and the silicon nitride layer at the bottom of the recess; wherein the contact holes connected with the upper surfaces of the metal gates are formed by etching the silicon oxide layer above the metal gates;

step 3: clearing by-products resulting from etching the contact holes by applying ion bombardment;

step 4: depositing a Ti layer and TiN layer sequentially on the contact holes;

step 5: forming a seed layer of Co on surfaces of the Ti layer and the TiN layer in the contact holes, depositing a Co layer on the Co seed layer in the contact holes and an upper surface of the silicon oxide layer;

step 6: performing chemical mechanical polishing for Co at the upper surface of the silicon oxide layer and the upper portion of the contact holes after filling with Co, until the Ti layer and the TiN layer at the upper surface of the silicon oxide layer are removed;

step 7: forming a cap layer covering the upper surface of Co within the contact holes and the upper surface of the silicon oxide layer; and step 8: performing laser annealing, wherein the Ti layer located at the bottoms of the contact holes in the source and drain structure reacts with silicon in the source and drain structure to form TiSi during the laser annealing process.

2. The method for reducing contact resistance according to claim 1, wherein the oxide filling the recess in step 1 is silicon oxide.

3. The method for reducing contact resistance according to claim 1, wherein a first dielectric layer and a second dielectric layer are disposed sequentially on side walls inside the recess in step 1, wherein the second dielectric layer is adhered to the first dielectric layer, and wherein bottoms of the first dielectric layer and the second dielectric layer are located at the upper surface of the source and drain structure; and wherein the oxide is filled in a space between the upper surface of the silicon nitride layer and the second dielectric layer at side walls of the recess.

4. The method for reducing contact resistance according to claim 1, wherein each of the metal gates in step 1 comprises a first U-shaped structure, a second U-shaped structure, a third U-shaped structure, and a third dielectric layer, wherein the first U-shaped structure, the second U-shaped structure, and the third U-shaped structure are stacked on top of each other from outside to inside, and wherein the third dielectric layer fills inside the third U-shaped structure.

5. The method for reducing contact resistance according to claim 1, wherein the contact holes connected with the upper surface of the source and drain structure and the contact holes connected with the upper surfaces of the metal gates formed in step 2 are formed during etching the silicon oxide layer in step 2.

6. The method for reducing contact resistance according to claim 1, wherein Ar ion bombardment is used in step 3 to clear by-products resulting from etching the contact holes.

7. The method for reducing contact resistance according to claim 1, wherein the Ti layer and the TiN layer are deposited sequentially on the upper surface of the silicon oxide layer and on the surfaces of the contact holes in step 4.

8. The method for reducing contact resistance according to claim 1, wherein a deposition process is applied to form the seed layer of Co in step 5.

9. The method for reducing contact resistance according to claim 1, wherein chemical plating is applied to fill Co within the contact holes in step 5.

10. The method for reducing contact resistance according to claim 1, wherein a thickness of the silicon oxide layer remaining after CMP in step 6 is about 210 Å.

11. The method for reducing contact resistance according to claim 1, wherein a thickness of the cap layer formed in step 7 is about 160 Å.

12. The method for reducing contact resistance according to claim 1, wherein the cap layer in step 7 is silicon nitride.

* * * * *